United States Patent
Esch

(10) Patent No.: US 6,816,430 B2
(45) Date of Patent: Nov. 9, 2004

(54) DEVICE FOR STORAGE OF MULTIPORT DATA, PARTICULARLY FOR AN ARITHMETIC AND LOGIC UNIT OF A DIGITAL SIGNAL PROCESSING PROCESSOR

(75) Inventor: Hélène Esch, Le Cheylas (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/611,323

(22) Filed: Jul. 1, 2003

(65) Prior Publication Data

US 2004/0057321 A1 Mar. 25, 2004

(30) Foreign Application Priority Data

Jul. 1, 2002 (FR) .......................................... 02 08208

(51) Int. Cl.⁷ ................................................. G11C 8/00
(52) U.S. Cl. ........................... 365/230.05; 365/189.12; 365/78
(58) Field of Search ....................... 365/230.05, 230.02, 365/189.12, 230.04, 189.02, 78, 230.03, 230.08; 377/78, 74

(56) References Cited

U.S. PATENT DOCUMENTS

| | | | |
|---|---|---|---|
| 4,390,970 A | * 6/1983 | Kay ........................... 365/73 |
| 5,245,575 A | * 9/1993 | Sasaki et al. .......... 365/189.12 |
| 5,513,363 A | 4/1996 | Kumar et al. ................ 395/800 |
| 5,678,035 A | 10/1997 | Takebe ........................ 395/518 |
| 5,708,618 A | * 1/1998 | Toda et al. ............. 365/230.05 |
| 6,084,819 A | 7/2000 | Kablanian ............... 365/230.03 |
| 6,151,244 A | * 11/2000 | Fujino et al. ................ 365/149 |
| 6,675,256 B1 | * 1/2004 | Harrand ....................... 711/105 |

* cited by examiner

Primary Examiner—Richard Elms
Assistant Examiner—Dang T Nguyen
(74) Attorney, Agent, or Firm—Lisa K. Jorgenson; Allen, Dyer, Doppelt, Milbrath & Gilchrist, P.A.

(57) ABSTRACT

The data storage device includes several registers that can be addressed by address words, and connected to p output ports through connections that can be configured in response to address words of p registers selected to read the contents of these registers on the p ports respectively. All register address words contain a specific bit with a predetermined rank identical for all address words and remaining bits. The registers are connected in pairs on each output port, each pair of registers containing two registers with address words that only differ in the value of the said specific bit. The connections include a pair of first switches that can be controlled in a complementary manner by the specific bit in the address word of one of the two registers, and a second switch connected to the output port considered and that can be controlled from the remaining bits of the address words of the two registers, for each pair of registers and for each output port, the first two switches are connected firstly between the corresponding two registers, and secondly between the corresponding second switch.

19 Claims, 4 Drawing Sheets

DEVICE FOR STORAGE OF MULTIPORT DATA, PARTICULARLY FOR AN ARITHMETIC AND LOGIC UNIT OF A DIGITAL SIGNAL PROCESSING PROCESSOR

FIELD OF THE INVENTION

The invention relates to devices for the storage of multi-port data, and particularly to a system of registers than can be addressed by an arithmetic and logic unit of a kernel of a digital signal processor (DSP), and including reading the contents of some of these registers.

BACKGROUND OF THE INVENTION

Conventionally, a processing kernel may manage 16 registers that are grouped together to form a storage device, for example. The purpose of these registers is to store data that can be used in different operations. The storage device comprises a number of output-ports (or read ports), for example 8. Consequently, up to eight registers can be read in one cycle of a clock signal controlling the speed of the processing kernel. And the same register may be read on the eight output ports.

In general, each output port (or read port) is associated with a path gate formed for example of two complementary MOS transistors controlled on their grids. Each register comprises a number of memory points, for example forty, to store 40-bit data. Since each memory point can be read on the eight read ports simultaneously, it is associated with eight path gates. Each of these path gates controls one line on which the 16 corresponding bits of the 16 registers are connected. Thus, a large capacity amplifier is provided to control 8 output ports behind 8 path gates. Since the capacitance of this large amplifier as seen on its input is high, an inverter is arranged between this amplifier and the memory point to protect it.

However, since 16 registers are connected on each read port, the total capacitance of the read port is very high (capacitance of the read port itself added to the 16 path gate drain capacitances). Furthermore, in the worst case, when the same register is read on the 8 read ports, its inverter sees 8 lines each connected to 16 registers. And in this configuration, the total capacitance as seen by the inverter associated with a register is composed of 8 line capacitances added to 128 drain capacitances of the path gate transistors.

And in this case, the gradient of the signal finally read on the output ports lasts for about 7 nanoseconds for a 0.18 micron technology, which is a problem and is usually outside the required specifications that specify that the duration of the gradient shall not exceed 3 nanoseconds for this technology.

Therefore, such devices require specific signal amplification (buffer), which increases the complexity of the device from the point of view of size and manufacturing cost. Furthermore, power consumption of such a device is high when switching output ports.

SUMMARY OF THE INVENTION

An object of the invention is to provide a device that does not include the drawbacks described above.

An object of the invention is to provide a registers system comprising a smaller number of components with a much lower gradient on its output ports than in the prior art, typically 2.5 times lower, so as to generate a large time saving.

Another object of the invention is to provide such a system with a low current consumption.

Another object of the invention is to provide decoding associated with this set of registers, which is much faster than the system usually used in prior art.

Therefore the invention provides a data storage device comprising several registers that can be addressed by address words, and connected to p output ports through connections/connecting means that can be configured in response to address words of p registers selected to read the contents of these registers on the p ports respectively.

According to one general characteristic of the invention, all register address words contain a specific bit with a predetermined rank identical for all address words (for example the high order bit) and remaining bits, the registers are connected in pairs on each output port, and each pair of registers contains two registers with address words that only differ in the value of the said specific bit.

Furthermore, for each pair of registers and for each output port, the connecting means comprise a pair of first switching means that can be controlled in a complementary manner by the specific bit in the address word of one of the two registers, and a second switching means connected to the output port considered and that can be controlled from the remaining bits of the address words of the two registers. The first two switching means are connected firstly between the corresponding two registers, and secondly between the corresponding second switching means.

Thus, according to the invention, the registers are combined in pairs and the only difference in their address words, which may be in the hexadecimal format, is in a single bit, for example the high order bit. This means that the two registers can be read through the same switching means decoded by the remaining bits of the address word. Consequently, the number of switching means attached to a read port will be halved.

Furthermore, the two switching means, in other words the switching means that are directly attached to the read ports, will be controlled much more quickly since they only concern the remaining bits in each address word, the specific bit, for example the high order bit, being used to select one of the two registers in a pair of registers directly.

According to one embodiment of the invention, the registers comprise m memory points so as to store data with m bits. Although the invention is vertically applicable for m=1, m is usually more than 1 and may for example be equal to 32 or 40.

The first switching means associated with a register in a pair then comprises m first elementary path gates, connected to the corresponding m memory points in the register. The first switching means associated with the other register in the pair comprises m other first elementary path gates connected to the corresponding m memory points of this register. A first elementary path gate connected to a memory point of the register is controlled in a complementary manner with respect to the other first elementary path gate connected to the corresponding memory point of the other register. Furthermore, the second switching means comprises m second elementary path gates, connected between the said output port considered and m pairs formed from s elementary path gates and the other first elementary path gates.

According to one embodiment of the invention, the device comprises a first elementary inverter connected between each memory point of a register and the p first elementary path gates associated with this register, and a second elementary inverter connected between each second elementary path gate connected to an output port and the pair formed by the first elementary path gate and the other first elementary path gate associated with the other register in the pair of registers.

For example, each first elementary path gate, and each other first elementary path gate may be formed by pairs of complementary MOS transistors. The grids of two opposite types of transistors (NMOS transistor and PMOS transistor), one belonging to one pair and the other belonging to the other pair, are connected together to enable complementary control of the first elementary path gate and of the other first elementary path gate. The first switching means associated with the two registers in a pair are located close to each other, in order to minimize the size of the device advantageously made in the form of an integrated circuit.

BRIEF DESCRIPTION OF THE DRAWINGS

Other advantages and characteristics of the invention will become clear after reading the detailed description of an embodiment that is in no way limitative, and the attached drawings on which.

DETAILED DESCRIPTION OF THE PREFERRED EMBODIMENTS

Figure 1:
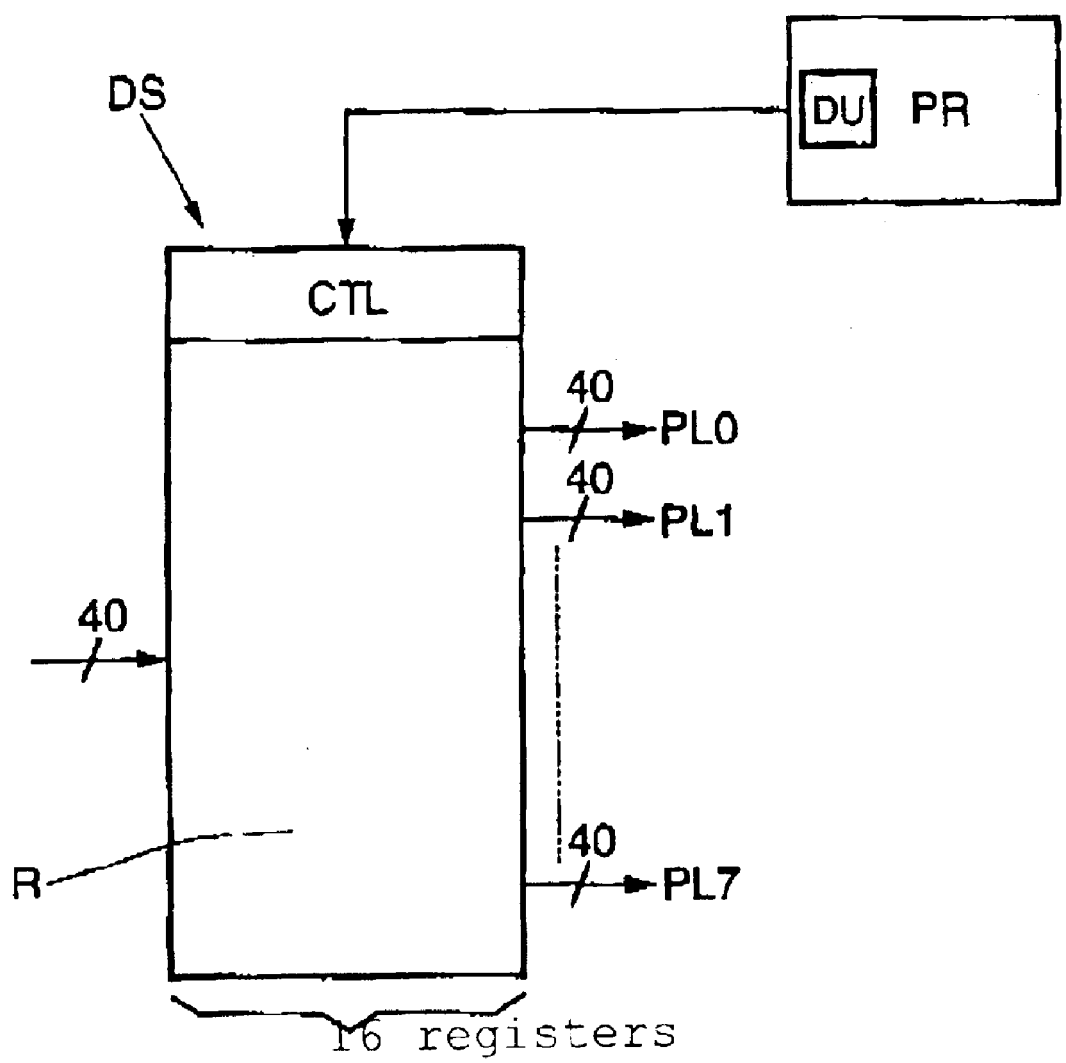
FIG. 1 is a schematic diagram illustrating an embodiment of a storage device according to the invention.

In FIG. 1, the reference DS denotes a data storage device formed of a set of registers R, in this case 16 registers, associated with control means/unit CTL to address some of these registers to read their contents on a number of output ports, in this case 8 output ports PL0–PL7. In this case, each of the 16 registers is a 40-memory point register, therefore capable of storing 40-bit data. Consequently, each of the output ports (or read ports) comprises 40 bit lines. Furthermore, the control means/unit CTL in this case are managed by a digital signal processor kernel PR, and particularly the arithmetic and logic unit DU of this processor.

Figure 2:
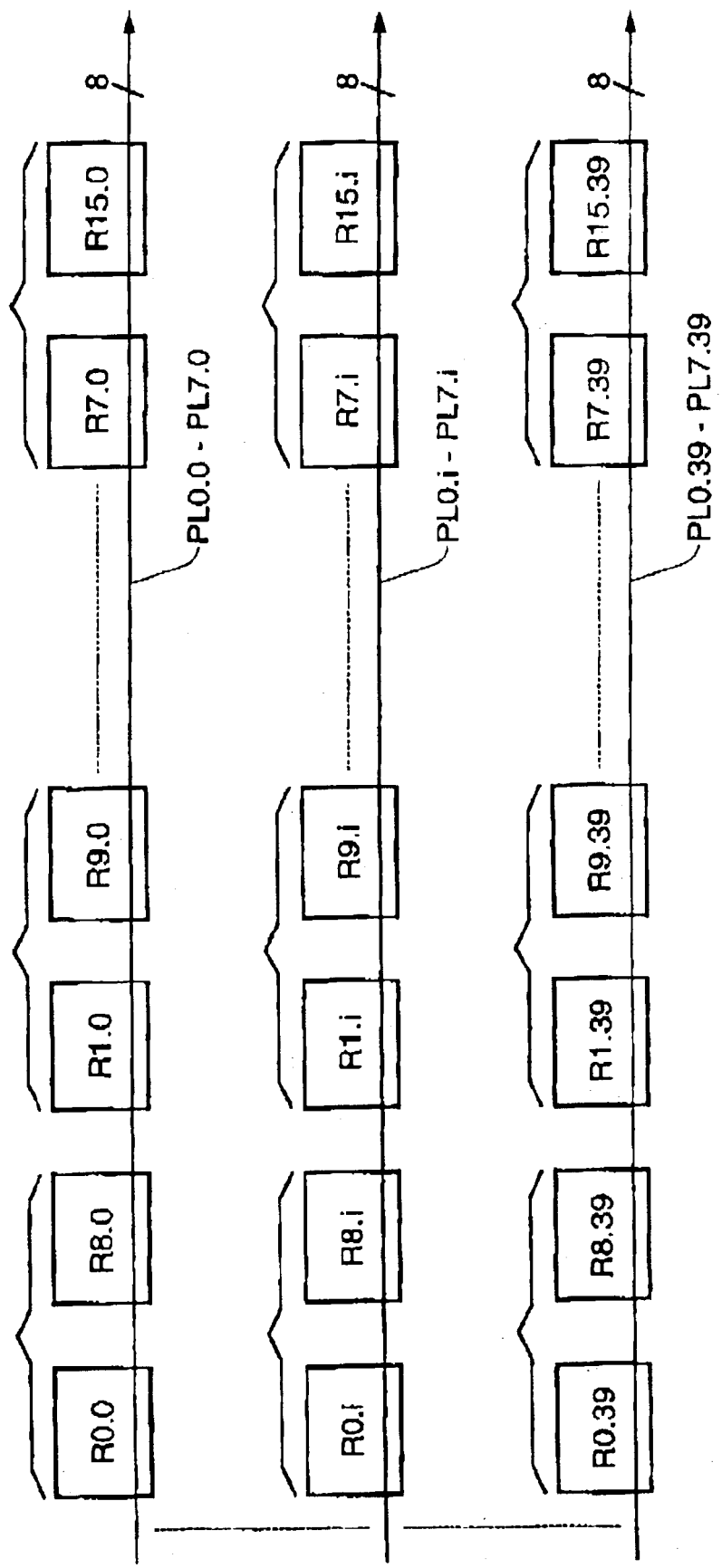
FIG. 2 is a schematic diagram illustrating several details of the device in FIG. 1.

FIG. 2 shows the different memory points Rj.i, where i=0 to 39, on each register Rj, where j=0 to 15. Furthermore, all memory points with the same index i, where i=0 to 39, are connected to the 8 bit lines PL0.i–PL7.i of the 8 read ports PL0–PL7. A detailed description of how these memory points are connected on these bit lines is given below.

One of the characteristics of the invention includes the grouping the registers in pairs, and consequently the corresponding memory points of these registers in pairs, as shown in FIG. 2. This grouping in pairs is done as a function of the value of the bits of the address word MAD used to address each register Rj (j=0 to 15). This grouping is illustrated particularly in FIG. 3. In this case each address word MAD contains 4 bits, since there are 16 registers. In the case shown, one of these bits, namely the high order bit reference A, is considered as being a specific bit. The remaining bits b0, b1 and b2 are low order bits of the address word MAD.

Figure 3:
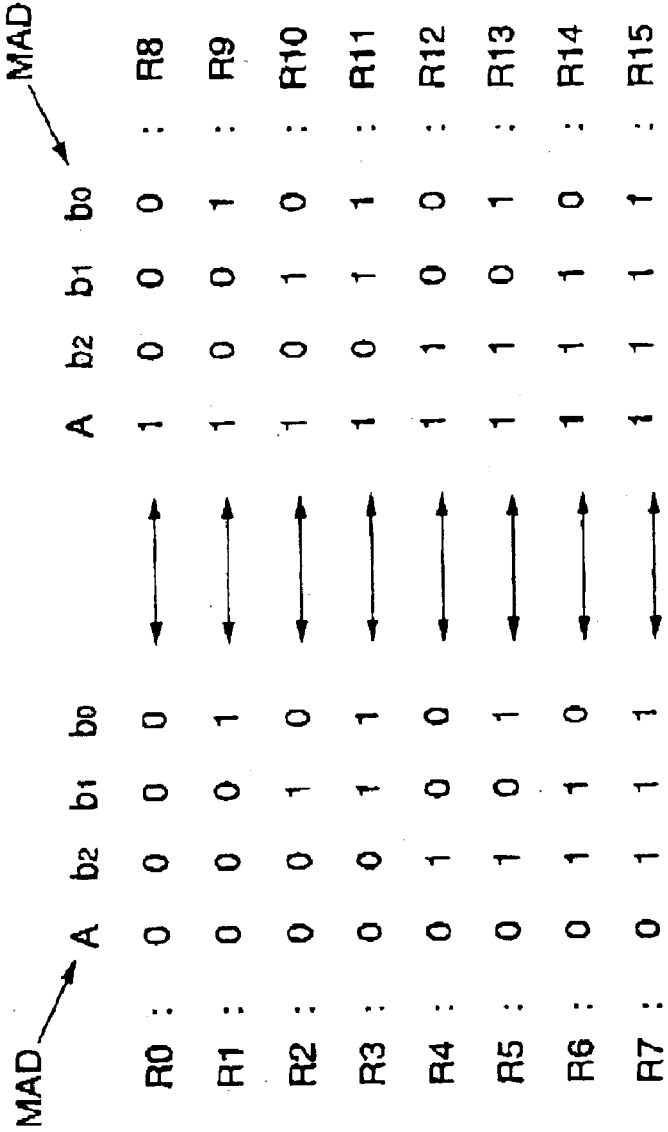
FIG. 3 is a schematic diagram illustrating coupling of pairs of registers in the device according to the invention.

In general, according to the invention, the registers are connected in pairs on each output port, each pair of registers containing two registers for which the only difference between the address words is in the value of the specific bit A. Consequently, the remaining bits of the address words of the two registers in a pair are identical. Therefore, FIG. 3 shows that the registers R0 and R8 will be connected together since the only difference in them is in the value of the high order bit A. The same is true for registers R1 and R9, R2 and R10, R3 and R11, R4 and R12, R5 and R13, R6 and R14, R7 and R15.

Figure 4:
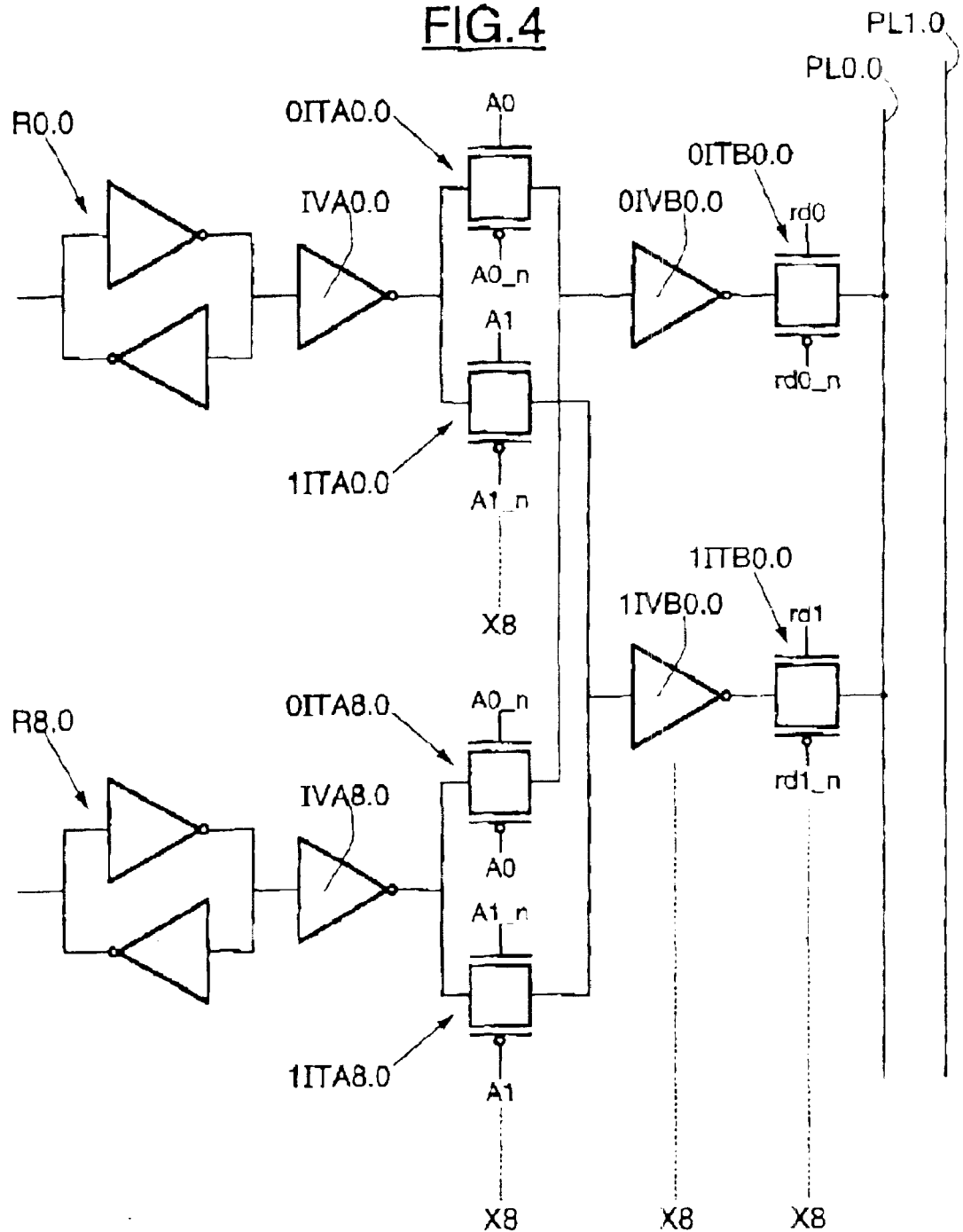
FIG. 4 is a schematic diagram illustrating part of the device in FIGS. 1 and 2 in more detail.

Referring more particularly to FIG. 4, a detailed description of the mutual connection of the two registers in a pair and their connection to the different output ports will now be described. For simplification reasons, FIG. 4 shows only memory point R0.0 of register R0, and memory point R8.0 of register R8. The following description for these two memory points is exactly the same for the other memory points of the registers.

In this case, each memory point is formed conventionally by two inverters installed top to bottom. In this case, for memory point R0.0 and memory point R8.0 coupled to it, the configurable connections/connection means connected between each memory point and the read ports comprise a first elementary path gate 0ITA.0.0 connected to memory point R0.0 through a first elementary inverter. IVA0.0. Moreover, another first elementary path gate 0ITA8.0 is connected to the memory point R8.0 through another first elementary inverter IVA8.0.

The first elementary path gate 0ITA0.0 and the other first elementary path gate 0ITA8.0 are also connected together. The common terminal between these two elementary path gates 0ITA0.0 and 0ITA8.0 is connected to a second elementary path gate 0ITB0.0 through a second elementary inverter 0IVB0.0. The second elementary path gate 0ITB0.0 is connected to the bit line PL0.0 of the read port PL0.

FIG. 4 shows that the first two elementary path gates 0ITA0.0 and 0ITA8.0 are controlled in a complementary manner. Each first elementary path gate is formed from two elementary MOS transistors, namely an NMOS transistor and a PMOS transistor. And the control gate of the NMOS transistor of the first elementary path gate 0ITA0.0 is connected to the control gate of the PMOS transistor of the other first elementary path gate 0ITA8.0. Similarly, the control gate of the PMOS transistor of the first elementary path gate 0ITA0.0 is connected to the control gate of the NMOS transistor of the other first elementary path gate 0ITA8.0.

And the control gate of the NMOS transistor of the first elementary path gate 0ITA0.0 and the control gate of the PMOS transistor of the first elementary path gate 0ITA8.0 are controlled by the value of the high order bit A0 of the address word MAD0 output by control means to address the registers selected on the read port PL0, in read.

Figure 5:
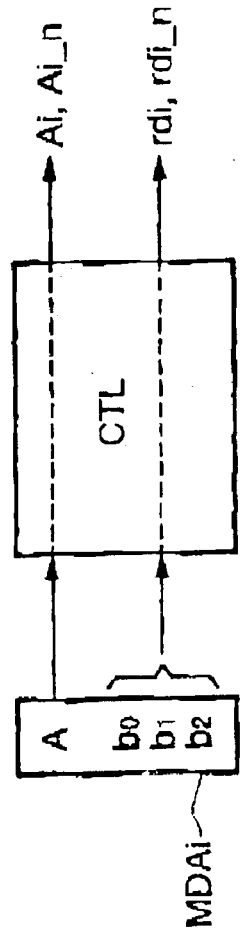
FIG. 5 is a schematic diagram illustrating m decodings of address words in more detail.

Therefore, it can immediately be seen that the value 1 for the bit A0 can be used to select memory point R0.0 while the value 0 can be used to select memory point R8.0 (in fact, the annotation A0_n denotes the complementary value of A0). Consequently, a given logical value for bit A0 can also be used to control the first elementary path gates associated with memory points with the same logical value of their high order bit, to make them conducting. This is why the effective selection of one of the registers will be made in combination with the high order bit A, by the remaining bits of the address word. In this respect, as shown in FIG. 5, the control means generate the values Ai and Ai_n from the high order bit A, and also the control signals rdi and rdi_n starting from the remaining bits b0, b1, b2 of the address word MADi.

These control signals rdi and rdi_n, for example rd0 and rd0_n, will control the second elementary path gate 0ITB0.0. Since in this case the device comprises 8 read ports, the first elementary path gates, the second elementary path gates and the second elementary inverters are repeated 8 times. More precisely, for example for bit line PL1.0 for read port PL1, a first elementary path gate 1ITA0.0 connected to the first elementary inverter IVA0.0 and another first elementary path gate 1ITA8.0 connected to the first elementary inverter 1IVA8.0 are provided. These first two elementary path gates 1TTA0.0 and 1ITA8.0 are connected together. Their common terminal is connected to the second elementary inverter 1ITB0.0 through a second elementary inverter 1IVB0.0. The second elementary inverter 1ITB0.0 is connected to the bit line PL10 of the read port PL1.

The first elementary path gates 1IA0.0 and 1ITA18.0 are controlled in a complementary manner by bit A1 in the address word MAD1 dedicated to the read port PL1. Similarly, the second elementary path gate 1ITB0.0 is controlled from the remaining bits of this address word.

Consequently, there are major advantages with this invention. The number of elementary path gates attached to read ports is only half the number used in prior art. The control means/unit CTL, in other words the decoding stage, are much faster since in the invention only three bits (the remaining bits) are decoded, instead of 4 as in prior art. The last bit, in fact the high order bit, directly controls the first elementary inverter without any decoding being necessary.

If the same register is read simultaneously on the 8 read ports, the first corresponding elementary inverters will be acted upon. However, each first elementary inverter will only see 16 elementary path gates and 8 second elementary inverters. Furthermore, each second elementary inverter controls a bit line connected to 8 second elementary path gates. And even if the 8 read ports are used to read the contents of the same register (which is the worst case), the second elementary inverters will only see one bit line capacitance (instead of 8 in prior art) and 8 elementary path gates (instead of 128 in prior art). Consequently, the gradient of the output signal is modified and is between 2 and 3 nanoseconds instead of 7 according to prior art. As a result, no particular additional amplification is necessary, and the speed is increased by 30%. Furthermore, current consumption is reduced due to the large reduction in the global capacitance seen by the output ports on the device.

The invention is not limited to the embodiments that have just been described, but it includes all variants. Thus, it can be applied to an arbitrary number of registers with an arbitrary number of read ports. The invention is still applicable even if the number of registers is odd. In this case, a single register will be isolated and the others will be connected in pairs as described above.

That which is claimed is:

1. A data storage device comprising:
    a plurality of registers that can be addressed by address words;
    p output ports; and
    connecting means for connecting the plurality of registers to the p output ports in response to address words of p registers selected to read contents of the registers on the p ports respectively;
    wherein all address words contain a specific bit and remaining bits, the registers are connected in pairs on each output port, each pair of registers including two registers with address words that only differ in a value of the specific bit, and for each pair of registers and for each output port, the connecting means comprise a pair of first switching means controlled in a complementary manner by the specific bit in the address word of one of the two registers, and a second switching means connected to the corresponding output port and controlled from the remaining bits of the address words of the two registers, the pair of first switching means being connected between the corresponding two registers and between the corresponding second switching means.

2. A device according to claim 1, wherein the registers comprise m memory points to store data with m bits; wherein one of the pair of first switching means associated with a register comprises m first elementary path gates connected to the corresponding m memory points in the register, the other of the pair of first switching means associated with the other register comprises m other first elementary path gates connected to the corresponding m memory points of the other register, a first elementary path gate connected to a memory point of the register being controlled in a complementary manner with respect to the other first elementary path gate connected to the corresponding memory point of the other register; and the second switching means comprises m second elementary path gates connected between the corresponding output port and m pairs formed from the first elementary path gates and the other first elementary path gates, respectively.

3. A device according to claim 2, further comprising:
    a first elementary inverter connected between each memory point of a register and the p first elementary path gates associated with the register; and
    a second elementary inverter connected between each second elementary path gate connected to an output port and the pair formed by the first elementary path gate and the other first elementary path gate associated with the other register in the pair of registers.

4. A device according to claim 2, wherein each first elementary path gate, and each other first elementary path gate comprise pairs of complementary MOS transistors, the control gates of two opposite types of transistors belonging respectively to the two pairs being connected together to enable complementary control of the first elementary path gate and of the other first elementary path gate.

5. A device according to claim 1, wherein the first switching means associated with the two registers in a pair are located relatively close to each other.

6. A device according to claim 1, wherein the registers, output ports and connecting means define an integrated circuit.

7. A device according to claim 1, further comprising:
    a controller to generate the address words; and
    a digital signal processor (DSP) to control the controller in a read mode.

8. A data storage device comprising:
    a plurality of registers with addresses having a specific bit and remaining bits;
    p output ports, the registers being connected in pairs on each output port, each pair of registers including two registers having addresses that only differ in a value of the specific bit; and
    connections to connect the plurality of registers to the p output ports in response to addresses of p registers selected to read contents of the registers on the p output ports respectively;
    for each pair of registers and for each output port, the connections comprise a pair of first complementary controlled switches controlled by the specific bit in the addresses of one of the pair of registers, and a second switch connected to the corresponding output port and controlled by the remaining bits of the addresses of the pair of registers, the pair of first complementary controlled switches being connected between the corresponding pair of registers, and between the corresponding pair of registers and the corresponding second switch.

9. A device according to claim 8, wherein the registers comprise m memory points to store data with m bits; wherein one of the pair of first switches associated with a register comprises m first elementary path gates connected to the corresponding m memory points in the register, the other of the pair of first switches associated with the other register comprises m other first elementary path gates connected to the corresponding m memory points of the other register, a first elementary path gate connected to a memory point of the register being controlled in a complementary manner with respect to the other first elementary path gate connected to the corresponding memory point of the other register; and the second switch comprises m second elementary path gates connected between the corresponding output port and m pairs formed from the first elementary path gates and the other first elementary path gates, respectively.

10. A device according to claim 9, further comprising:
a first elementary inverter connected between each memory point of a register and the p first elementary path gates associated with the register; and
a second elementary inverter connected between each second elementary path gate connected to an output port and the pair formed by the first elementary path gate and the other first elementary path gate associated with the other register in the pair of registers.

11. A device according to claim 10, wherein each first elementary path gate, and each other first elementary path gate comprise pairs of complementary MOS transistors, the control gates of two opposite types of transistors belonging respectively to the two pairs being connected together for complementary control of the first elementary path gate and of the other first elementary path gate.

12. A device according to claim 8, wherein the first switches associated with the two registers in a pair are located relatively close to each other.

13. A device according to claim 8, wherein the registers, output ports and connections define an integrated circuit.

14. A device according to claim 8, further comprising:
a controller to generate the addresses; and
a digital signal processor (DSP) to control the controller in a read mode.

15. A method of reading data in a data storage device comprising:
providing a plurality of registers with addresses having a specific bit and remaining bits;
providing p output ports, the registers being connected in pairs on each output port, each pair of registers including two registers having addresses that only differ in a value of the specific bit; and
providing connections to connect the plurality of registers to the p output ports in response to addresses of p registers selected to read contents of the registers on the p output ports respectively;
for each pair of registers and for each output port, the connections comprise a pair of first complementary controlled switches controlled by the specific bit in the addresses of one of the pair of registers, and a second switch connected to the corresponding output port and controlled by the remaining bits of the addresses of the pair of registers, the pair of first complementary controlled switches being connected between the corresponding pair of registers, and between the corresponding pair of registers and the corresponding second switch.

16. A method according to claim 15, wherein the registers comprise m memory points to store data with m bits; wherein one of the pair of first switches associated with a register comprises m first elementary path gates connected to the corresponding m memory points in the register, the other of the pair of first switches associated with the other register comprises m other first elementary path gates connected to the corresponding m memory points of the other register, a first elementary path gate connected to a memory point of the register being controlled in a complementary manner with respect to the other first elementary path gate connected to the corresponding memory point of the other register; and the second switch comprises m second elementary path gates connected between the corresponding output port and m pairs formed from the first elementary path gates and the other first elementary path gates, respectively.

17. A method according to claim 16, further comprising:
connecting a first elementary inverter between each memory point of a register and the p first elementary path gates associated with the register; and
connecting a second elementary inverter between each second elementary path gate connected to an output port and the pair formed by the first elementary path gate and the other first elementary path gate associated with the other register in the pair of registers.

18. A method according to claim 15, wherein each first elementary path gate, and each other first elementary path gate comprise pairs of complementary MOS transistors, the control gates of two opposite types of transistors belonging respectively to the two pairs being connected together for complementary control of the first elementary path gate and of the other first elementary path gate.

19. A method according to claim 15, further comprising:
generating the addresses with a controller; and
controlling the controller in a read mode with a digital signal processor (DSP).

* * * * *